(12) United States Patent
Mekonnen et al.

(10) Patent No.: US 11,322,445 B2
(45) Date of Patent: May 3, 2022

(54) EMIB COPPER LAYER FOR SIGNAL AND POWER ROUTING

(71) Applicant: Intel Corporation, Santa Clara, CA (US)

(72) Inventors: Yidnekachew S. Mekonnen, Chandler, AZ (US); Dae-Woo Kim, Phoenix, AZ (US); Kemal Aygun, Tempe, AZ (US); Sujit Sharan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 596 days.

(21) Appl. No.: 16/319,647

(22) PCT Filed: Sep. 12, 2016

(86) PCT No.: PCT/US2016/051320
§ 371 (c)(1),
(2) Date: Jan. 22, 2019

(87) PCT Pub. No.: WO2018/048443
PCT Pub. Date: Mar. 15, 2018

(65) Prior Publication Data
US 2021/0296240 A1  Sep. 23, 2021

(51) Int. Cl.
*H01L 23/34* (2006.01)
*H01L 23/48* (2006.01)
(Continued)

(52) U.S. Cl.
CPC ...... *H01L 23/5381* (2013.01); *H01L 21/4846* (2013.01); *H01L 21/56* (2013.01);
(Continued)

(58) Field of Classification Search
CPC ............ H01L 25/0652; H01L 23/5226; H01L 23/528; H01L 24/97; H01L 24/82;
(Continued)

(56) References Cited

U.S. PATENT DOCUMENTS 8,901,748 B2 * 12/2014 Manusharow .......... H01L 24/20
257/777
2006/0226527 A1 * 10/2006 Hatano ............... H01L 25/0655
257/686
(Continued)

FOREIGN PATENT DOCUMENTS

KR    20160043997 A    4/2016
WO    WO-2018048443 A1    3/2018

OTHER PUBLICATIONS

"International Application Serial No. PCT/US2016/051320, International Search Report dated May 31, 2017", 3 pgs.
(Continued)

*Primary Examiner* — Alonzo Chambliss
(74) *Attorney, Agent, or Firm* — Schwegman Lundberg & Woessner, P.A.

(57) ABSTRACT

Embedded Multi-die Interconnect Bridge (EMIB) technology provides a bridge die, where the EMIB includes multiple signal and power routing layers. The EMIB eliminates the need for TSVs required by the SIP assembly silicon interposers. In an embodiment, the EMIB includes at least one copper pad. The copper pad may be configured to protect the EMIB during wafer thinning. The copper pad may be connected to another copper pad to provide signal routing, thereby increasing the signal contact density. The copper pad may be configured to provide an increased power delivery to one or more connected dies.

20 Claims, 4 Drawing Sheets

(51) Int. Cl.
*H01L 21/44* (2006.01)
*H01L 23/538* (2006.01)
*H01L 21/48* (2006.01)
*H01L 23/498* (2006.01)
*H01L 23/31* (2006.01)
*H01L 23/522* (2006.01)
*H01L 21/56* (2006.01)
*H01L 23/00* (2006.01)
*H01L 23/528* (2006.01)
*H01L 25/065* (2006.01)

(52) U.S. Cl.
CPC ........ *H01L 23/3107* (2013.01); *H01L 23/481* (2013.01); *H01L 23/49838* (2013.01); *H01L 23/528* (2013.01); *H01L 23/5226* (2013.01); *H01L 23/5386* (2013.01); *H01L 24/18* (2013.01); *H01L 24/82* (2013.01); *H01L 24/97* (2013.01); *H01L 25/0652* (2013.01)

(58) Field of Classification Search
CPC . H01L 21/56; H01L 23/481; H01L 23/49838; H01L 23/3107; H01L 24/18; H01L 23/5381; H01L 23/5386; H01L 21/4846
See application file for complete search history.

(56) References Cited

U.S. PATENT DOCUMENTS

| | | |
|---|---|---|
| 2007/0075431 A1 | 4/2007 | Miyazaki et al. |
| 2007/0222059 A1 | 9/2007 | Roberts et al. |
| 2014/0091474 A1* | 4/2014 | Starkston ............... H01L 24/14 257/774 |
| 2014/0264791 A1* | 9/2014 | Manusharow ...... H01L 25/0655 257/666 |
| 2015/0011050 A1 | 1/2015 | Chiu et al. |
| 2016/0043056 A1* | 2/2016 | Chiu ................... H01L 21/4803 257/741 |
| 2016/0056125 A1* | 2/2016 | Pan ......................... H01L 25/50 257/676 |
| 2016/0218092 A1 | 7/2016 | Chang et al. |

OTHER PUBLICATIONS

"International Application Serial No. PCT/US2016/051320, Written Opinion dated May 31, 2017", 8 pgs.
"International Application Serial No. PCT US2016 051320, International Preliminary Report on Patentability dated Mar. 21, 2019", 10 pgs.

* cited by examiner

EMIB COPPER LAYER FOR SIGNAL AND POWER ROUTING

This application is a U.S. National Stage Application under 35 U.S.C. 371 from International Application No. PCT/US2016/051320, filed Sep. 12, 2016, which is hereby incorporated by reference in its entirety.

TECHNICAL FIELD

Embodiments described herein generally relate to electrical interconnections in electronic devices.

BACKGROUND

An integrated circuit (IC) is often implemented as a discrete block (e.g., die). During manufacturing of an electronic device, the die is connected to a circuit board. The die may be connected directly to the circuit board in a chip-on-board (COB) configuration, or may be connected via one or more intermediate layers. Multiple dies may be connected to a circuit board to form a system-in-package (SIP) assembly. A SIP assembly may include one or more intermediate SIP substrate layers, where the SIP substrate layers may include laminate substrates, capacitive substrates (e.g. coated ceramic, coated glass, or coated metal), or semiconductor substrates. A problem faced by SIP assemblies is that the SIP substrate includes conductive traces and contacts that are much wider and more spaced apart than the conductive traces and contacts on the die. This discrepancy limits the number and type of dies that may be connected to the SIP substrate, and results in contact routing congestion on the SIP substrate.

To address this contact size discrepancy, a silicon interposer may be included between the dies and the SIP substrate. One side of the silicon interposer includes a relatively larger array of contacts (e.g., solder balls) that correspond to the SIP substrate contacts. The other side of the silicon interposer includes a relatively smaller array of contacts that correspond to the die contacts. The silicon interposer includes through-silicon vias (TSVs), where each TSV provides an electrical connection between a contact within the larger array of contacts and a corresponding contact within the smaller array of contacts. However, silicon interposers include several limitations, including material stress management, heat generation, process integration, and fabrication of TSVs between each pair of contacts.

It is desirable to improve the SIP assembly while reducing the difficulties associated with SIP assembly manufacturing.

DESCRIPTION OF EMBODIMENTS

Embedded Multi-die Interconnect Bridge (EMIB) technology provides technical solutions to technical problems facing SIP assembly silicon interposers. Instead of fabricating a large silicon interposer, EMIB uses a small bridge die, where the EMIB includes multiple signal and power routing layers. The EMIB is embedded between dies during the substrate fabrication process.

The EMIB provides several advantages over SIP assembly silicon interposers. The EMIB eliminates the need for TSVs required by the SIP assembly silicon interposers. This avoids the need for TSV cavity formation, TSV filling, and backside silicon interposer processing to reveal the TSVs. By avoiding the silicon interposer, the EMIB allows a die to be assembled directly to the SIP, such as using standard flip-chip assembly processes. The EMIB elements described herein provide additional advantages over SIP assembly silicon interposers.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
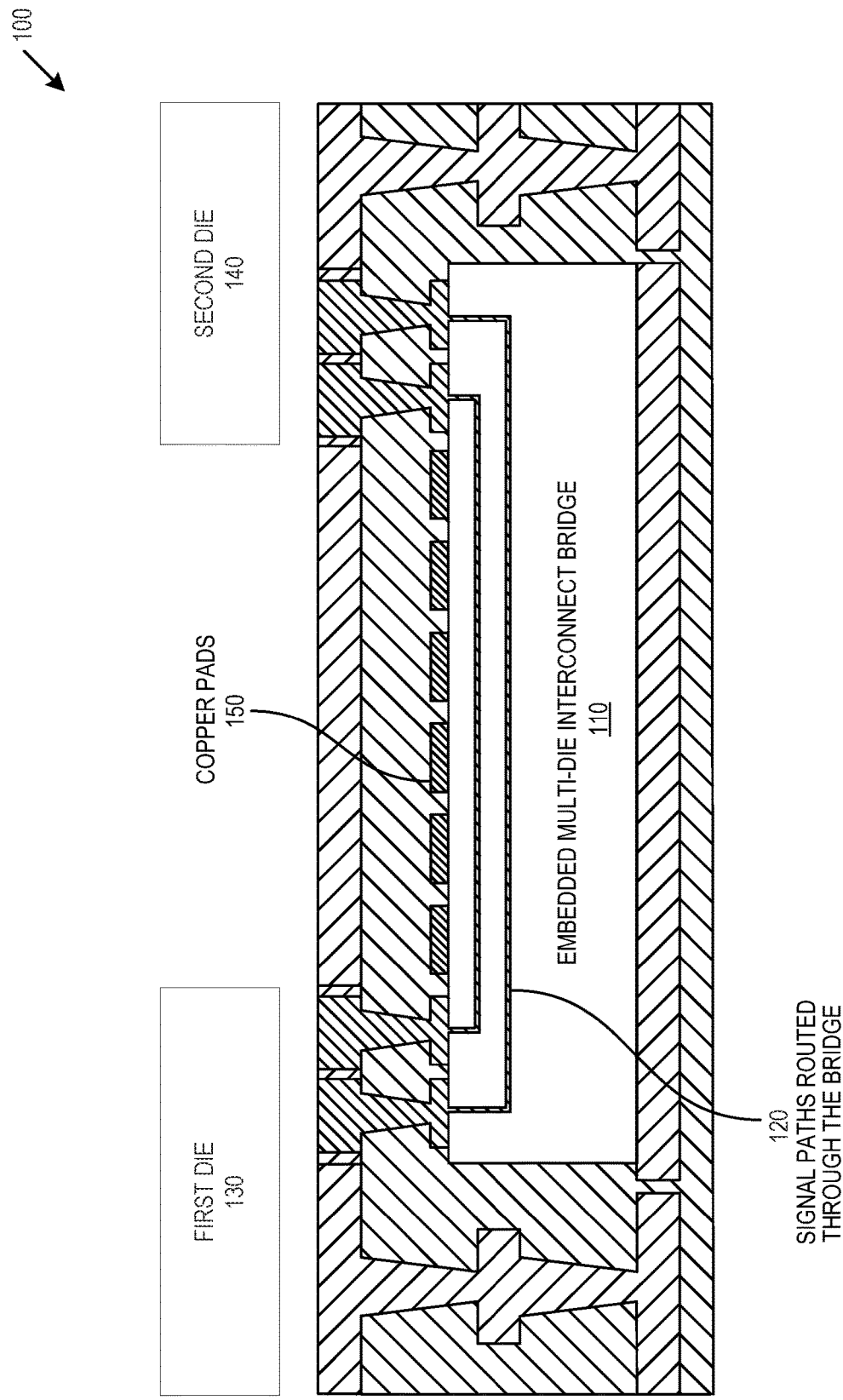
FIG. 1 is a block diagram of a first EMIB configuration, in accordance with at least one embodiment of the invention.

FIG. 1 is a block diagram of a first EMIB configuration 100, in accordance with at least one embodiment of the invention. The first EMIB configuration 100 includes an EMIB 110. The EMIB includes one or more signal paths 120 routed through the EMIB, where the signal paths 120 are used to connect electrical contacts on a first die 130 to electrical contacts on a second die 140. The formation of the EMIB includes formation of the signal paths within the EMIB substrate, followed by wafer thinning (e.g., mechanical grinding, chemical mechanical polishing (CMP)). However, wafer thinning may result in undesired effects for the EMIB, such as an EMIB that is delaminated, deformed (e.g., bowl-shaped), or thin and brittle. To reduce or eliminate effects caused by wafer thinning, one or more copper pads 150 are applied to the EMIB. The copper pads 150 may be subjected to the wafer thinning, but serve to protect the EMIB structure. In an example, the copper pads 150 are between 5 micrometers and 6 micrometers in thickness. The copper pads 150 may be used to provide additional features, such as signal routing shown and described with respect to FIG. 2.

Figure 2:
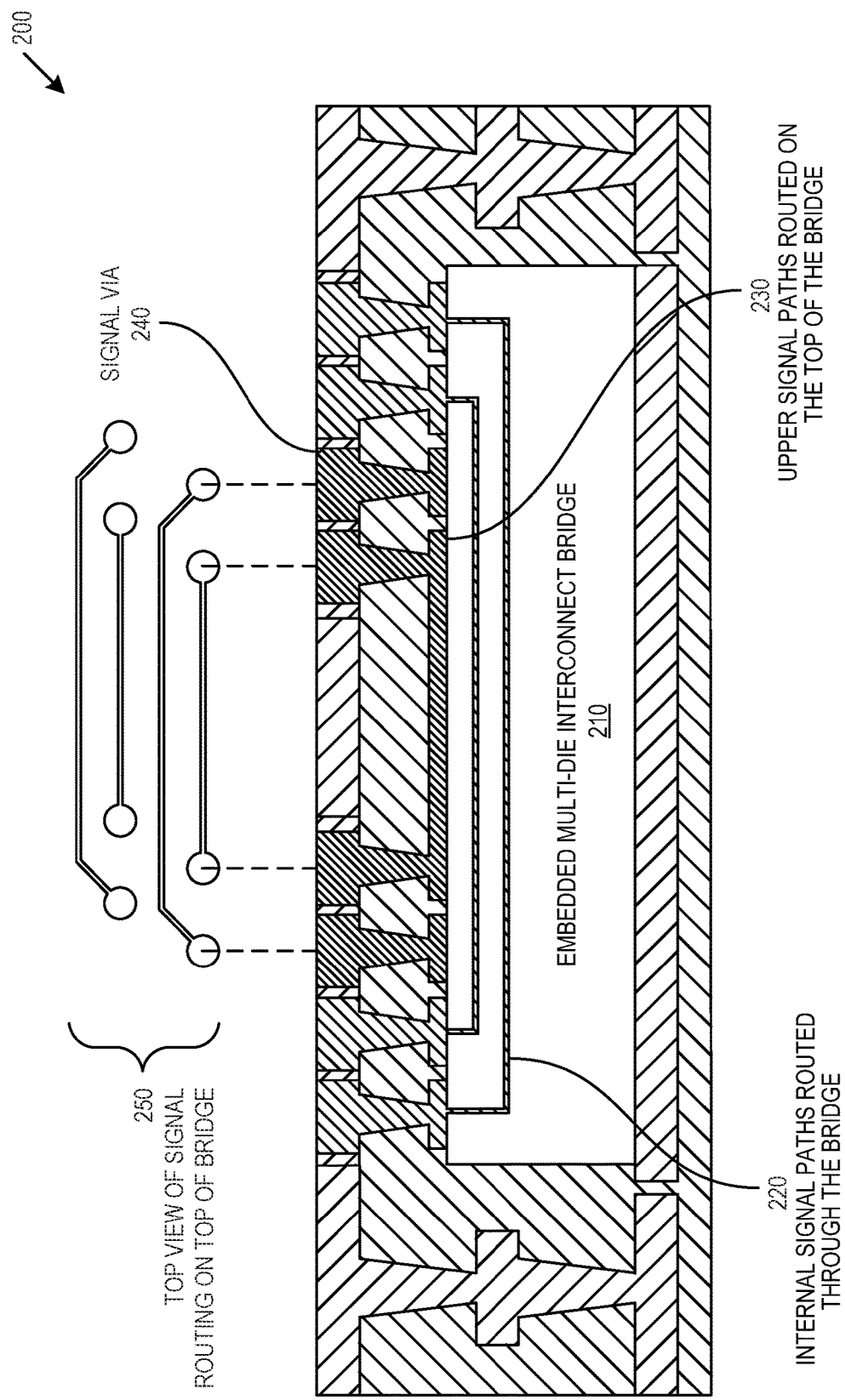
FIG. 2 is a block diagram of a second EMIB configuration, in accordance with at least one embodiment of the invention.

FIG. 2 is a block diagram of a second EMIB configuration 200, in accordance with at least one embodiment of the invention. The second EMIB configuration 200 includes an EMIB 210 with one or more internal signal paths 220 routed through the EMIB 210. In addition to the internal signal paths 220 routed through the EMIB 210, upper signal paths 230 may be formed from copper pads disposed on an upper portion of the EMIB. The upper signal paths 230 provide an upper signal routing layer. The upper signal routing layer is electrically connected to the surface of the package through one or more signal vias 240, where the signal vias 240 provide a signal contact with one or more die contacts.

The upper signal routing layer provides an increased contact density (e.g., input/output (I/O) density) of EMIB packages. The increased contact density may be used to increase the number of dies, or may be used to provide connections for current or future dies with increased contact density. To provide for increased contact density, the surface contacts and contact traces may be arranged as shown in the top view 250 of the signal routing. The arrangement of the surface contacts and contact traces may be selected to provide a desired electrical characteristic, such as a desired impedance. The arrangement of the surface contacts and contact traces may also be selected to reduce or eliminate undesirable signal effects, such as parasitic capacitance, signal cross-coupling, or other unwanted effects. In an example, the contact traces that are at least 6 micrometers in width may provide the desired characteristics.

Figure 3:
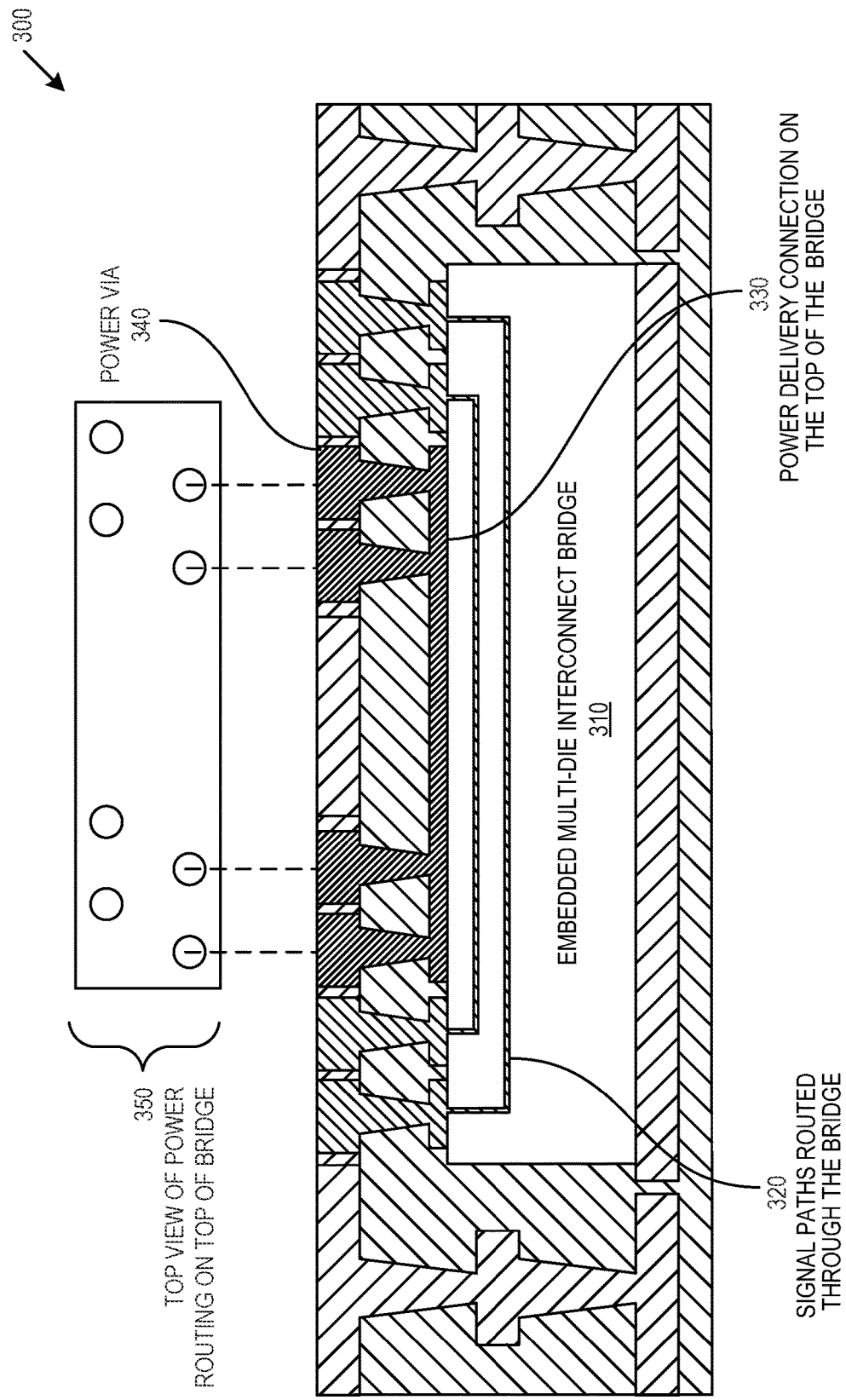
FIG. 3 is a block diagram of a third EMIB configuration, in accordance with at least one embodiment of the invention.

FIG. 3 is a block diagram of a third EMIB configuration 300, in accordance with at least one embodiment of the invention. The third EMIB configuration 300 includes an EMIB 310 with one or more internal signal paths 320 routed through the EMIB 310. In addition to the internal signal paths 320 routed through the EMIB 310, a power delivery connection 330 may be formed from a copper pad disposed on an upper portion of the EMIB. The power delivery connection 330 is electrically connected to the surface of the package through one or more power vias 340, where the power vias 340 provide a power contact with one or more die contacts. To provide for increased power delivery, the copper pad may be formed as a single copper pad, such as shown in the top view 350 of the power routing. The power delivery connection 330 provides an additional current path, which may be used in addition to or in place of another power delivery connection within the EMIB 310. The additional current path provided by the power delivery connection 330 increases the power delivery and performance of the EMIB package.

In one embodiment, the increased contact density of the second EMIB configuration 200 is combined with the improved power delivery of the third EMIB configuration 300. The combination of the increased contact density and power delivery may be used in existing designs, such as connecting two central processing units (CPUs) through an EMIB. The combination of the increased contact density and power delivery may be used in future designs that require increased contact density and power delivery, such as high bandwidth memory (HBM). The EMIB signal or power routing may be used for various products that use two or more interconnected dies, including central processing units (CPUs), servers, system-on-a-chip (SOC) devices, memory devices, graphics devices, field programmable gate array (FPGA) devices, and other devices that use EMIB package architecture. The EMIB signal or power routing may also be used in combination with various types of circuit interconnects, including specially designed interconnects such as the Common System Interface (CSI), the QuickPath Interconnect (QPI), Ultra Path Interconnect (UPI), or Keizer Technology Interconnect (KTI).

Figure 4:
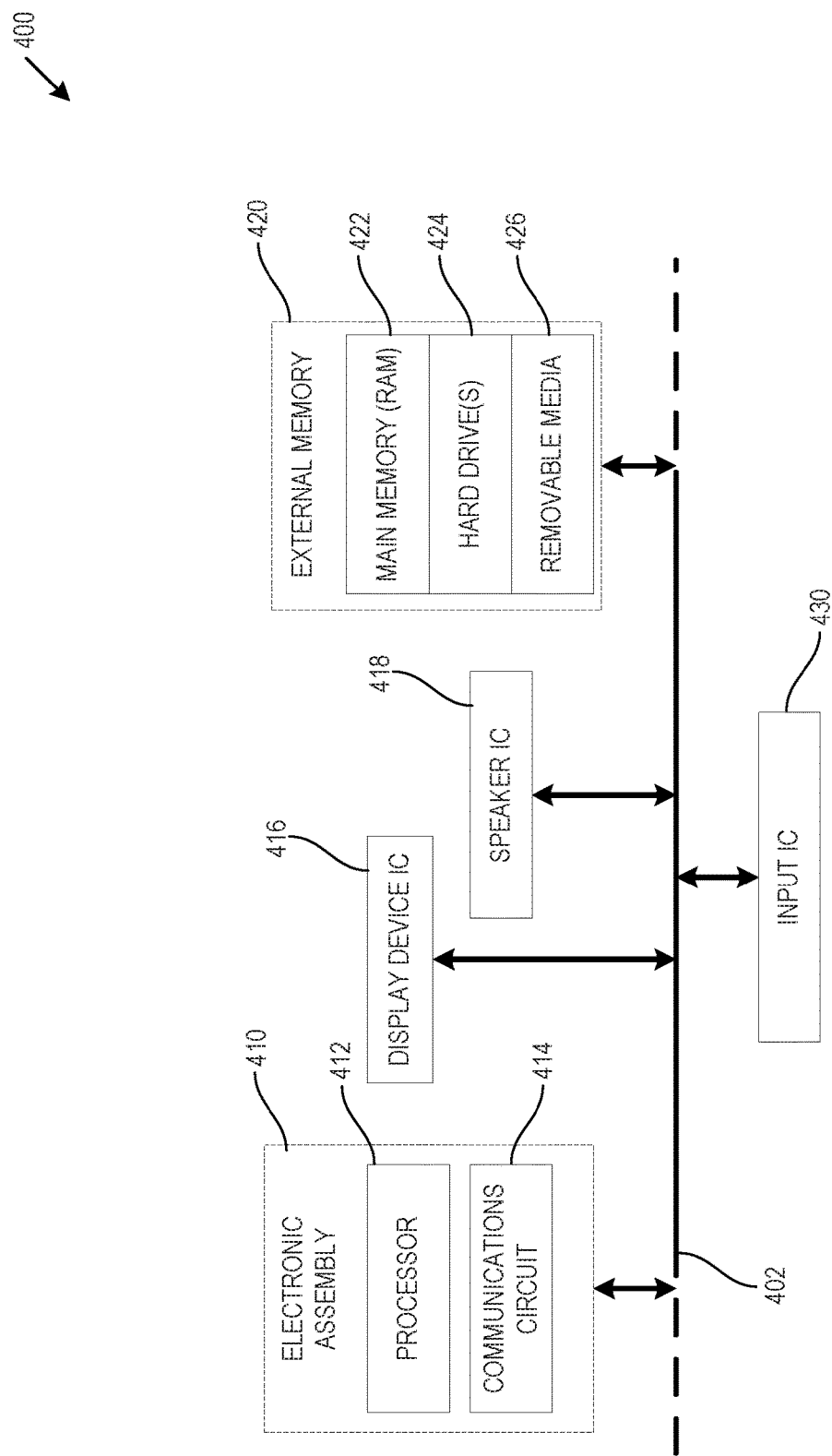
FIG. 4 is a block diagram of an electronic device that may use EMIB signal or power routing in accordance with at least one embodiment of the invention.

FIG. 4 is a block diagram of an electronic device 400 that may use the EMIB routing apparatus or method in accordance with at least one embodiment of the invention. FIG. 4 is included to show an example of a higher-level device application for the present invention. Examples of electronic devices 400 that can use the EMIB routing include, but are not limited to personal computers, tablet computers, mobile telephones, game devices, MP3 or other digital music players, etc. In this example, electronic device 400 comprises a data processing system that includes a system bus 402 to couple the various components of the system. System bus 402 provides communications links among the various components of the electronic device 400 and can be implemented as a single bus, as a combination of busses, or in any other suitable manner.

The EMIB signal or power routing may be used within an electronic assembly 410 coupled to system bus 402. The electronic assembly 410 can include any circuit or combination of circuits, including IC dies connected via EMIB signal or power routing. In one embodiment, the electronic assembly 410 includes a processor 412 that can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits using EMIB signal or power routing that can be included in electronic assembly 410 are a custom circuit, an application-specific integrated circuit (ASIC), or the like, such as, for example, one or more circuits (such as a communications circuit 414) for use in wireless devices like mobile telephones, personal data assistants, portable computers, two-way radios, and similar electronic systems. The IC can perform any other type of function.

The electronic device 400 can also include an external memory 420 that can use the EMIB signal or power routing. External memory 420 can include one or more memory elements suitable to the particular application, such as a main memory 422 in the form of random access memory (RAM), one or more hard drives 424, and/or one or more drives that handle removable media 426 such as compact disks (CD), flash memory cards, digital video disk (DVD), and the like.

The EMIB signal or power routing may be used for various interface circuits, such as within a display device IC 416, one or more speakers 418, and an input IC 430, where the input IC can include a mouse, trackball, touch screen, voice-recognition device, or any other device that permits a system user to input information into and receive information from the electronic device 400.

To better illustrate the method and apparatuses disclosed herein, a non-limiting list of embodiments is provided here:

Example 1 is an apparatus comprising: an embedded multi-die interconnect bridge (EMIB), the EMIB including a plurality of EMIB signal paths routed through the EMIB, the plurality of EMIB signal paths to connect a first plurality of contacts on a first die to a second plurality of contacts on a second die; and a first copper pad disposed on an upper surface of the EMIB.

In Example 2, the subject matter of Example 1 optionally includes wherein the first copper pad is disposed within a plurality of EMIB embedded signal path contacts.

In Example 3, the subject matter of any one or more of Examples 1-2 optionally include wherein a first copper pad structure is selected to protect the upper surface of the EMIB from effects of wafer thinning.

In Example 4, the subject matter of any one or more of Examples 1-3 optionally include a second copper pad disposed on the upper surface of the EMIB, the first copper pad connected via a signal contact trace to the second copper pad to provide signal routing.

In Example 5, the subject matter of Example 4 optionally includes a first signal via connected to the first copper pad; and a second signal via connected to the second copper pad, the first signal via and the second signal via to convey a signal between a first signal contact on the first die to a second signal contact on the second die.

In Example 6, the subject matter of any one or more of Examples 4-5 optionally include wherein a signal contact trace structure is selected to provide a desired signal characteristic.

In Example 7, the subject matter of Example 6 optionally includes wherein the desired signal characteristic includes a desired impedance.

In Example 8, the subject matter of any one or more of Examples 6-7 optionally include wherein the desired signal characteristic includes a reduction of undesirable signal effects.

In Example 9, the subject matter of any one or more of Examples 6-8 optionally include wherein the desired signal characteristic includes a signal contact trace width of at least 6 micrometers.

In Example 10, the subject matter of any one or more of Examples 1-9 optionally include wherein the first copper pad provides a power delivery connection.

In Example 11, the subject matter of Example 10 optionally includes a first power via connected to the first copper pad to convey power from the first copper pad to a first power contact on the first die; and a second power via connected to the first copper pad to convey power from the first copper pad to a second power contact on the second die.

Example 12 is a method comprising disposing a first copper pad on an upper surface of an embedded multi-die interconnect bridge (EMIB), the EMIB including a plurality of EMIB signal paths routed through the EMIB, the plurality of EMIB signal paths to connect a first plurality of contacts on a first die to a second plurality of contacts on a second die.

In Example 13, the subject matter of Example 12 optionally includes wherein disposing the first copper pad includes disposing the first copper pad within a plurality of EMIB embedded signal path contacts.

In Example 14, the subject matter of any one or more of Examples 12-13 optionally include wherein a first copper pad structure is selected to protect the upper surface of the EMIB from effects of wafer thinning.

In Example 15, the subject matter of any one or more of Examples 12-14 optionally include disposing a second copper pad on the upper surface of the EMIB, the first copper pad connected via a signal contact trace to the second copper pad to provide signal routing.

In Example 16, the subject matter of Example 15 optionally includes disposing a first signal via on the first copper pad; and disposing a second signal via on the second copper pad, the first signal via and the second signal via to convey a signal between a first signal contact on the first die to a second signal contact on the second die.

In Example 17, the subject matter of any one or more of Examples 15-16 optionally include wherein a signal contact trace structure is selected to provide a desired signal characteristic.

In Example 18, the subject matter of Example 17 optionally includes wherein the desired signal characteristic includes a desired impedance.

In Example 19, the subject matter of any one or more of Examples 17-18 optionally include wherein the desired signal characteristic includes a reduction of undesirable signal effects.

In Example 20, the subject matter of any one or more of Examples 17-19 optionally include wherein the desired signal characteristic includes a signal contact trace width of at least 6 micrometers.

In Example 21, the subject matter of any one or more of Examples 12-20 optionally include disposing a first power via on a first location on the first copper pad, the first power via to convey power from the first copper pad to a first power contact on the first die; and disposing a second power via on a second location on the first copper pad, the second power via to convey power from the first copper pad to a second power contact on the second die.

Example 22 is a machine-readable medium including instructions, which when executed by a computing system, cause the computing system to perform any of the methods of Examples 12-21.

Example 23 is an apparatus comprising means for performing any of the methods of Examples 12-21.

Example 24 is at least one machine-readable storage medium, comprising a plurality of instructions that, responsive to being executed with processor circuitry of a computer-controlled device, cause the computer-controlled device to dispose a first copper pad on an upper surface of an embedded multi-die interconnect bridge (EMIB), the EMIB including a plurality of EMIB signal paths routed through the EMIB, the plurality of EMIB signal paths to connect a first plurality of contacts on a first die to a second plurality of contacts on a second die.

In Example 25, the subject matter of Example 24 optionally includes the instructions further causing the computer-controlled device to dispose the first copper pad within a plurality of EMIB embedded signal path contacts.

In Example 26, the subject matter of any one or more of Examples 24-25 optionally include the instructions further causing the computer-controlled device to select a first copper pad structure to protect the upper surface of the EMIB from effects of wafer thinning.

In Example 27, the subject matter of any one or more of Examples 24-26 optionally include the instructions further causing the computer-controlled device to dispose a second copper pad on the upper surface of the EMIB, the first copper pad connected via a signal contact trace to the second copper pad to provide signal routing.

In Example 28, the subject matter of Example 27 optionally includes the instructions further causing the computer-controlled device to: dispose a first signal via on the first copper pad; and dispose a second signal via on the second copper pad, the first signal via and the second signal via to convey a signal between a first signal contact on the first die to a second signal contact on the second die.

In Example 29, the subject matter of any one or more of Examples 27-28 optionally include the instructions further causing the computer-controlled device to select a signal contact trace structure to provide a desired signal characteristic.

In Example 30, the subject matter of Example 29 optionally includes wherein the desired signal characteristic includes a desired impedance.

In Example 31, the subject matter of any one or more of Examples 29-30 optionally include wherein the desired signal characteristic includes a reduction of undesirable signal effects.

In Example 32, the subject matter of any one or more of Examples 29-31 optionally include wherein the desired signal characteristic includes a signal contact trace width of at least 6 micrometers.

In Example 33, the subject matter of any one or more of Examples 24-32 optionally include the instructions further causing the computer-controlled device to: dispose a first power via on a first location on the first copper pad, the first power via to convey power from the first copper pad to a first power contact on the first die; and dispose a second power via on a second location on the first copper pad, the second power via to convey power from the first copper pad to a second power contact on the second die.

Example 34 is a apparatus comprising means for disposing a first copper pad on an upper surface of an embedded multi-die interconnect bridge (EMIB), the EMIB including a plurality of EMIB signal paths routed through the EMIB, the plurality of EMIB signal paths to connect a first plurality of contacts on a first die to a second plurality of contacts on a second die.

In Example 35, the subject matter of Example 34 optionally includes wherein means for disposing the first copper pad includes means for disposing the first copper pad within a plurality of EMIB embedded signal path contacts.

In Example 36, the subject matter of any one or more of Examples 34-35 optionally include means for selecting a first copper pad structure to protect the upper surface of the EMIB from effects of wafer thinning.

In Example 37, the subject matter of any one or more of Examples 34-36 optionally include means for disposing a second copper pad on the upper surface of the EMIB, the first copper pad connected via a signal contact trace to the second copper pad to provide signal routing.

In Example 38, the subject matter of Example 37 optionally includes means for disposing a first signal via on the first copper pad; and means for disposing a second signal via on the second copper pad, the first signal via and the second signal via to convey a signal between a first signal contact on the first die to a second signal contact on the second die.

In Example 39, the subject matter of any one or more of Examples 37-38 optionally include means for selecting a signal contact trace structure to provide a desired signal characteristic.

In Example 40, the subject matter of Example 39 optionally includes wherein the desired signal characteristic includes a desired impedance.

In Example 41, the subject matter of any one or more of Examples 39-40 optionally include wherein the desired signal characteristic includes a reduction of undesirable signal effects.

In Example 42, the subject matter of any one or more of Examples 39-41 optionally include wherein the desired signal characteristic includes a signal contact trace width of at least 6 micrometers.

In Example 43, the subject matter of any one or more of Examples 34-42 optionally include means for disposing a first power via on a first location on the first copper pad, the first power via to convey power from the first copper pad to a first power contact on the first die; and means for disposing a second power via on a second location on the first copper pad, the second power via to convey power from the first copper pad to a second power contact on the second die.

These and other examples and features of the present molds, mold systems, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An apparatus comprising:
an embedded multi-die interconnect bridge (EMIB), the EMIB including a plurality of EMIB signal paths routed through the EMIB, the plurality of EMIB signal paths to connect a first plurality of contacts on a first die to a second plurality of contacts on a second die; and
a first copper pad disposed on an upper surface of the EMIB;
wherein a first copper pad structure includes one or more electrically isolated copper pads to protect the upper surface of the EMIB from effects of wafer thinning.

2. The apparatus of claim 1, wherein the first copper pad is disposed within a plurality of EMIB embedded signal path contacts.

3. The apparatus of claim 1, further including a second copper pad disposed on the upper surface of the EMIB, the first copper pad connected via a signal contact trace to the second copper pad to provide signal routing.

4. The apparatus of claim 3, further including;
a first signal via connected to the first copper pad; and
a second signal via connected to the second copper pad, the first signal via and the second signal via to convey a signal between a first signal contact on the first die to a second signal contact on the second die.

5. The apparatus of claim 3, wherein a signal contact trace structure of the signal contact trace connecting the first copper pad to the second copper pad is selected to provide a desired signal characteristic.

6. The apparatus of claim 5, wherein the desired signal characteristic includes a desired impedance.

7. The apparatus of claim 5, wherein the desired signal characteristic includes a reduction of undesirable signal effects.

8. The apparatus of claim 5, wherein the desired signal characteristic includes a signal contact trace width of at least 6 micrometers.

9. The apparatus of claim 1, wherein the first copper pad provides a power delivery connection.

10. The apparatus of claim 9, further including;
a first power via connected to the first copper pad to convey power from the first copper pad to a first power contact on the first die; and
a second power via connected to the first copper pad to convey power from the first copper pad to a second power contact on the second die.

11. A method comprising disposing a first copper pad on an upper surface of an embedded multi-die interconnect bridge (EMIB), the EMIB including a plurality of EMIB signal paths routed through the EMIB, the plurality of EMIB signal paths to connect a first plurality of contacts on a first die to a second plurality of contacts on a second die; wherein a first copper pad structure includes one or more electrically isolated copper pads to protect the upper surface of the EMIB from effects of wafer thinning.

12. The method of claim 11, wherein disposing the first copper pad includes disposing the first copper pad within a plurality of EMIB embedded signal path contacts.

13. The method of claim 11, further including disposing a second copper pad on the upper surface of the EMIB, the first copper pad connected via a signal contact trace to the second copper pad to provide signal routing.

14. The method of claim 13, further including;
disposing a first signal via on the first copper pad; and
disposing a second signal via on the second copper pad, the first signal via and the second signal via to convey a signal between a first signal contact on the first die to a second signal contact on the second die.

15. The method of claim 11, further including;
disposing a first power via on a first location on the first copper pad, the first power via to convey power from the first copper pad to a first power contact on the first die; and
disposing a second power via on a second location on the first copper pad, the second power via to convey power from the first copper pad to a second power contact on the second die.

16. At least one machine-readable storage medium, comprising a plurality of instructions that, responsive to being executed with processor circuitry of a computer-controlled device, cause the computer-controlled device to dispose a first copper pad on an upper surface of an embedded multi-die interconnect bridge (EMIB), the EMIB including a plurality of EMIB signal paths routed through the EMIB, the plurality of EMIB signal paths to connect a first plurality of contacts on a first die to a second plurality of contacts on a second die; wherein a first copper pad structure includes one or more electrically isolated copper pads to protect the upper surface of the EMIB from effects of wafer thinning.

17. The at least one machine-readable storage medium of claim 16, the instructions further causing the computer-controlled device to dispose the first copper pad within a plurality of EMIB embedded signal path contacts.

18. The at least one machine-readable storage medium of claim 16, the instructions further causing the computer-controlled device to dispose a second copper pad on the upper surface of the EMIB, the first copper pad connected via a signal contact trace to the second copper pad to provide signal routing.

19. The at least one machine-readable storage medium of claim 18, the instructions further causing the computer-controlled device to:
dispose a first signal via on the first copper pad; and
dispose a second signal via on the second copper pad, the first signal via and the second signal via to convey a signal between a first signal contact on the first die to a second signal contact on the second die.

20. The at least one machine-readable storage medium of claim 16, the instructions further causing the computer-controlled device to:
dispose a first power via on a first location on the first copper pad, the first power via to convey power from the first copper pad to a first power contact on the first die; and
dispose a second power via on a second location on the first copper pad, the second power via to convey power from the first copper pad to a second power contact on the second die.

* * * * *